United States Patent
Lee et al.

(10) Patent No.: US 7,877,865 B2
(45) Date of Patent: Feb. 1, 2011

(54) METHOD OF FORMING A WIRING HAVING CARBON NANOTUBE

(75) Inventors: Sun-Woo Lee, Incheon (KR); Seong-Ho Moon, Suwon-si (KR); Dong-Woo Kim, Incheon (KR); Jung-Hyeon Kim, Hwaseong-si (KR); Hong-Sik Yoon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 12/387,299

(22) Filed: Apr. 29, 2009

(65) Prior Publication Data

US 2009/0271982 A1 Nov. 5, 2009

(30) Foreign Application Priority Data

May 1, 2008 (KR) .................. 10-2008-0040975

(51) Int. Cl.
*H01R 43/00* (2006.01)
*H01L 21/44* (2006.01)

(52) U.S. Cl. ..................... 29/825; 29/832; 438/680; 438/681; 438/685; 438/686; 438/687

(58) Field of Classification Search ............ 29/825, 29/832; 438/680, 681, 685, 686, 687
See application file for complete search history.

(56) References Cited

U.S. PATENT DOCUMENTS

| | | | |
|---|---|---|---|
| 7,094,692 B2 * | 8/2006 | Horibe et al. | 438/680 |
| 7,749,801 B2 * | 7/2010 | Choi et al. | 438/95 |
| 2005/0215049 A1 * | 9/2005 | Horibe et al. | 438/622 |
| 2006/0278901 A1 * | 12/2006 | Dangelo et al. | 257/276 |
| 2007/0158697 A1 | 7/2007 | Choi et al. | |

FOREIGN PATENT DOCUMENTS

| | | |
|---|---|---|
| KR | 10-0490480 | 5/2005 |
| KR | 10-0674144 B1 | 1/2007 |
| KR | 10-0721020 B1 | 5/2007 |

* cited by examiner

*Primary Examiner*—C. J Arbes
(74) *Attorney, Agent, or Firm*—Mills & Onello, LLP

(57) ABSTRACT

In a method of forming a wiring having a carbon nanotube, a lower wiring is formed on a substrate, and a catalyst layer is formed on the lower wiring. An insulating interlayer is formed on the substrate to cover the catalyst layer, and an opening is formed through the insulating interlayer to expose an upper face of the catalyst layer. A carbon nanotube wiring is formed in the opening, and an upper wiring is formed on the carbon nanotube wiring and the insulating interlayer to be electrically connected to the carbon nanotube wiring. A thermal stress is generated between the carbon nanotube wiring and the upper wiring to produce a dielectric breakdown of a native oxide layer formed on a surface of the carbon nanotube wiring. A wiring having a reduced electrical resistance between the carbon nanotube wiring and the upper wiring may be obtained.

13 Claims, 10 Drawing Sheets

(A)　　　　　　　(B)　　　　　　　(C)

METHOD OF FORMING A WIRING HAVING CARBON NANOTUBE

BACKGROUND

1. Field

Example embodiments relate to a method of forming a wiring including a carbon nanotube. More particularly, example embodiments relate to a method of forming a wiring including a carbon nanotube having reduced contact resistance.

2. Description of the Related Art

Semiconductor devices having high data transmission speed are desired for many applications. One way of increasing the data transmission speed of a semiconductor device may be to increase integration degree in device chips such that a chip includes a large number of cells. A design rule for wirings in semiconductor chips has been reduced to a nanometer scale to increase the integration degree of the cells. However, reducing the design rule of the wiring may cause some technical problems. For example, specific resistance of a wiring may exponentially increase depending on a decrease of a critical dimension of the wiring. Hillocks caused by electromigration (which may increase the likelihood of cuts in the metal wiring) may occur. Formation of a diffusion barrier layer may become difficult in some applications. To overcome these problems, techniques for forming a wiring using a carbon nanotube have been investigated.

A carbon nanotube has a one-dimensional quantum-wire structure. The carbon nanotube also has electrical characteristics such as a quantum transport in one dimension. The carbon nanotube may have a good current density characteristic, as compared with a metal wiring. For example, it has been experimentally proven that the carbon nanotube may have a current density of about $10^9$ A/cm$^2$, and may exhibit ballistic transport characteristics.

There are some obstacles to the use of a carbon nanotube as a wiring of a semiconductor device. For example, the carbon nanotube may have poor adhesiveness to a metal and/or high contact resistance at an interface with a metal. The carbon nanotube has a relatively low specific resistance (e.g., at least about 1 µAcm), which may be lower than a specific resistance of copper. However, when contact resistance between the carbon nanotube and a metal is high, benefits and drawbacks of using the carbon nanotube may offset each other due to an overall increase in resistance. A carbon nanotube wiring has been widely researched by several companies (e.g., Infenion, Fujitsu, Samsung Electronics, etc).

SUMMARY

Example embodiments provide a method of forming a wiring including a carbon nanotube to reduce a contact resistance at an interface between a carbon nanotube wiring and a metal wiring.

According to some example embodiments, there is provided a method of forming a wiring including a carbon nanotube. In the method, a lower wiring is formed on a substrate, and a catalyst layer is formed on the lower wiring. An insulating interlayer is formed on the substrate to cover the catalyst layer, and an opening is formed through the insulating interlayer to expose an upper face of the catalyst layer. A carbon nanotube wiring is formed in the opening, and an upper wiring is formed on the carbon nanotube wiring and the insulating interlayer to be electrically connected to the carbon nanotube wiring. A thermal stress is generated between the carbon nanotube wiring and the upper wiring to produce a dielectric breakdown of a native oxide layer formed on a surface of the carbon nanotube wiring. A wiring having a reduced electrical resistance between the carbon nanotube wiring and the upper wiring is obtained.

In an example embodiment, the thermal stress may be generated by providing current to the carbon nanotube wiring, and the thermal stress may induce partial melting of a metal contained in the upper wiring. An amount of the current provided to the carbon nanotube wiring may be in a range of from about 1 mA to about 5 mA. Forming the carbon nanotube wiring may include growing at least one carbon nanotube from the catalyst layer toward an entrance of the opening; forming a capping layer on the insulating interlayer to fill the opening in which the carbon nanotube is formed; and performing a chemical mechanical polishing (CMP) process on the capping layer until upper faces of the insulating interlayer pattern and the at least one carbon nanotube are exposed. The native oxide layer may be formed on an upper surface of the carbon nanotube wiring by a reaction with a slurry composition applied to the CMP process, which may be performed for polishing an upper portion of the carbon nanotube wiring.

The method may further comprise forming a first contact metal layer on the lower wiring before forming the catalyst layer.

A second contact metal layer may also be formed on the carbon nanotube wiring and the insulating interlayer before the upper wiring is formed. The second contact metal layer may be formed using a metal including titanium (Ti) to have a thickness sufficient to inhibit a metal atom of the upper wiring from being diffused up to the carbon nanotube wiring.

According to some example embodiments, there is provided a method of forming a wiring including a carbon nanotube in a semiconductor device. In the method, a lower wiring is formed on a substrate, and a catalyst layer is formed of the lower wiring. An insulating interlayer having an opening which exposes the catalyst layer is formed on the catalyst layer and the substrate. A carbon nanotube is grown from the catalyst layer toward an entrance of the opening. A capping layer is formed on the insulating interlayer to fill the opening in which the carbon nanotube is formed. The capping layer and the carbon nanotube may be partially removed to form a carbon nanotube wiring by performing a CMP process until upper faces of the insulating interlayer and the carbon nanotube are exposed. A native oxide layer is formed on the carbon nanotube wiring while performing the CMP process. The native oxide layer is removed from an upper surface of the carbon nanotube wiring, and the insulating interlayer is partially removed such that an upper portion of the carbon nanotube wiring is protruded from the insulating interlayer. An upper wiring electrically connected to the carbon nanotube wiring is formed on the carbon nanotube wiring and the insulating interlayer. Electrical resistance between the carbon nanotube wiring and the upper wiring in semiconductor device is reduced.

In some embodiments, the native oxide layer may be removed by performing a cleaning process using a cleaning solution including hydrofluoric acid. In some embodiments, the native oxide layer may be removed by performing an etching process using plasma. In some embodiments, forming the upper wiring electrically connected to the carbon nanotube wiring may further comprise generating a thermal stress between the carbon nanotube wiring and the upper wiring to partially melt a metal of the upper wiring. The thermal stress may be generated by providing current of from about 1 mA to about 5 mA to the carbon nanotube wiring.

According to example embodiments, a native oxide layer formed at an interface between a carbon nanotube wiring and an upper wiring may be dielectrically broken down by generating a thermal stress between the carbon nanotube wiring and the upper wiring.

Accordingly, electrical contact resistance between the carbon nanotube wiring and the upper wiring may be reduced. A portion of a contact metal layer contacting to the carbon nanotube wiring may be partially melted by the thermal stress. Therefore, the carbon nanotube wiring may be electrically or directly connected to the upper wiring via the contact metal layer and electrical resistance of the wiring may further decreases. In addition, adhesiveness between the carbon nanotube wiring and the contact metal layer may also increase, and stability of a device or a manufacturing efficiency may be enhanced.

BRIEF DESCRIPTION OF THE DRAWINGS

The foregoing and other features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF EXAMPLE EMBODIMENTS

Figure 1:
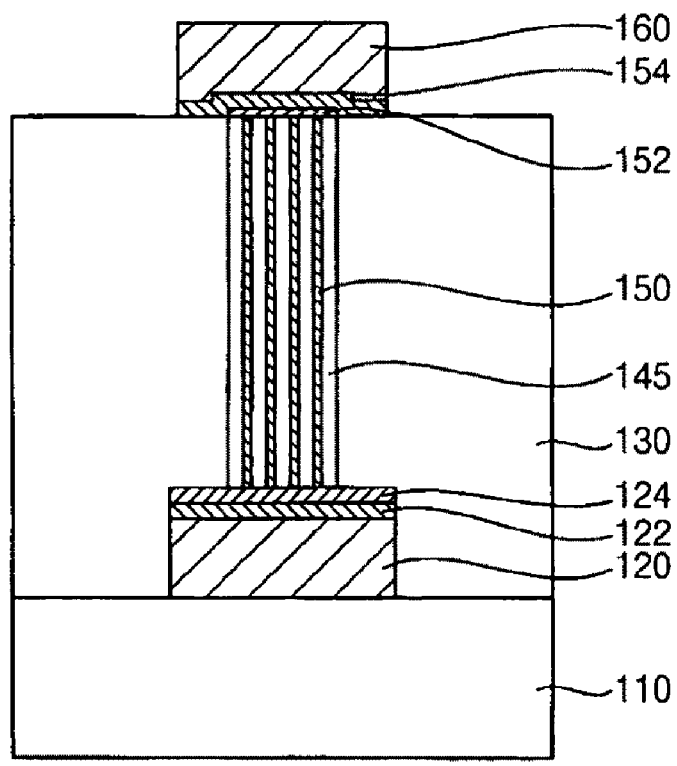
FIG. 1 is a cross-sectional view illustrating a wiring including a carbon nanotube wiring according to some example embodiments.

This application claims priority under 35 U.S.C. §119 to Korean Patent Application No. 10-2008-0040975, filed on May 1, 2008 in the Korean Intellectual Property Office (KIPO), the contents of which are herein incorporated by reference in their entirety.

Various example embodiments will be described more fully hereinafter with reference to the accompanying drawings, in which some example embodiments are shown. Example embodiments may, however, be embodied in many different forms and should not be construed as limited to the example embodiments set forth herein. Rather, these example embodiments are provided so that this description will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which example embodiments belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiment 1

FIG. 1 is a cross-sectional view illustrating a wiring including a carbon nanotube wiring according to some example embodiments.

Referring to FIG. 1, a semiconductor device may include a substrate 110, a lower wiring 120 provided on the substrate 110, a first contact metal layer 122, a catalyst layer 124, an insulating interlayer pattern 130, a capping layer pattern 145, a carbon nanotube wiring 150, a native oxide layer 152 being dielectrically broken down, a second contact metal layer 154 and a upper wiring 160.

The substrate 110 may include a silicon substrate, a silicon germanium substrate, an epitaxial substrate, etc. Several conductive structures may be formed on the substrate 110. Examples of the conductive structures may include a transistor (not illustrated), a capacitor (not illustrated), a contact pad (not illustrated) of the capacitor, which is electrically connected to a first contact region of the transistor, a bit line (not illustrated) electrically connected to a second contact region of the transistor, etc.

The lower wiring 120 is provided on the substrate 110. The lower wiring 120 may be electrically connected to the conductive structure on the substrate 110. The lower wiring 120 may include a metal having a good conductivity.

For example, the lower wiring 120 may be a contact pad or other wirings to be electrically connected to a source region of a metal oxide semiconductor field effect transistor (MOSFET).

The first contact metal layer 122 may be provided on the lower wiring 120. The first contact metal layer 122 may include a metal having relatively strong adhesiveness to the catalyst layer 124 and the lower wiring 120. Examples of the metal that may be included in the first contact metal layer 122 include titanium (Ti), platinum (Pt), palladium (Pd), etc. These may be used alone or in a combination thereof. For example, the first contact metal layer 122 may be a titanium layer.

The catalyst layer 124 may be provided on the first contact metal layer 122. The catalyst layer 124 may be a catalytic metal layer or a porous active layer. The catalyst layer 124 may accelerate the growth of a carbon nanotube on the surface of the first contact metal layer 122. The catalytic metal layer may include a metal. Examples of the metal that may be used in the catalytic metal layer include tungsten (W), nickel (Ni), iron (Fe), cobalt (Co), lead (Pb), yttrium (Y), palladium (Pd), platinum (Pt), gold (Au), etc. These may be used alone or in a combination thereof. The catalytic metal layer may be formed to have a thickness of about several nanometers to about several tens of nanometers.

The insulating interlayer pattern 130 having an opening which partially or fully exposes the catalyst layer 124 may be provided on the substrate 110 and the catalyst layer 124. The opening may have a diameter of about several nanometers to several tens of nanometers depending on a diameter of the carbon nanotube wiring 150. The insulating interlayer pattern 130 may include silicon oxide. Examples of silicon oxide may include boro-phosphor silicate glass (BPSG), phosphor silicate glass (PSG), undoped silicate glass (USG), spin-on glass (SOG), tetraethyl orthosilicate (TEOS), PE-TEOS (plasma enhanced-tetra ethylorthosilicate), etc. These may be used alone or in a combination thereof.

The carbon nanotube wiring 150 may be provided on the catalyst layer 124 in the opening of the insulating interlayer pattern 130. The carbon nanotube wiring 150 may be electrically connected to the lower wiring 120. A carbon nanotube may be grown from a surface of the catalyst layer 124 exposed through the opening of the insulating interlayer pattern 130 to form the carbon nanotube wiring 150. In some example embodiments, an upper face of the carbon nanotube wiring 150 may be substantially disposed level with an upper face of the insulating interlayer pattern 130.

The capping layer pattern 145 may be formed on the catalyst layer 124 to fill the opening in which the carbon nanotube wiring 150 is formed. The capping layer that fills the opening and surrounds the carbon nanotube wiring 150 may prevent or inhibit the carbon nanotube wiring 150 from being damaged while a chemical mechanical polishing (CMP) process is performed.

The native oxide layer 152 being dielectrically broken down may be provided on a surface of the carbon nanotube wiring 150. The native oxide layer may be formed on the carbon nanotube wiring 150 by a reaction of the carbon nanotube with a slurry composition used in the CMP process. The native oxide layer 152 may have poor electrical insulation properties, because the native oxide layer may be dielectrically broken down or cracked by a thermal stress. The thermal stress may be generated by heat provided by applied current. For example, heat may be generated up to a temperature of about 400° C. to about 600° C. Such heat may cause an insulation breakdown of the native oxide layer and a partial melting of a metal at a portion of the second contact metal layer 154 which may make contact with the carbon nanotube wiring 150.

The second contact metal layer 154 may be provided on the carbon nanotube wiring 150 and the insulating interlayer pattern 130. The second contact metal layer 154 may include a metal having relatively strong adhesiveness to the upper wiring 160 (subsequently formed), the carbon nanotube wiring 150 and the insulating interlayer pattern 130. Examples of the metal that may be included in the second contact metal layer 154 include titanium (Ti), platinum (Pt), palladium (Pd), etc. These may be used alone or in a combination thereof.

In one example embodiment, the second contact metal layer 154 may include platinum (Pt) or palladium (Pd), which may have a relatively strong adhesiveness to the carbon nanotube wiring 150 and a relatively weak adhesiveness to the insulating interlayer pattern 130. In another example embodiment, the second contact metal layer 154 may include titanium (Ti), which may have a relatively strong adhesiveness to both the carbon nanotube wiring 150 and the insulating interlayer pattern 130. The second contact metal layer 154 may have a thickness sufficient to inhibit a metal atom of the upper wiring 160 from being diffused up to the carbon nanotube wiring 150. Therefore, a portion of the second contact metal layer 154 contacting the carbon nanotube wiring 150 may be prevented from being alloyed with the metal atom diffused from the upper wiring 160.

The upper wiring 160 may be provided on the second contact metal layer 154 having a thickness more than a given or predetermined thickness. The upper wiring 160 may be formed using a metal and/or a metal compound. Examples of the metal in the upper wiring 160 may include tantalum (Ta), copper (Cu), tungsten (W), titanium (Ti), aluminum (Al), etc. Examples of the metal compound in the upper wiring 160 may include tantalum nitride (TaNx), copper nitride (CuNx), tungsten nitride (WNx), titanium nitride (TiNx), aluminum nitride (AlNx), etc. These may be used alone or in a combination thereof.

FIGS. 2 to 5 are cross-sectional views illustrating a method of forming a wiring including a carbon nanotube wiring according to example embodiments.

Figure 2:
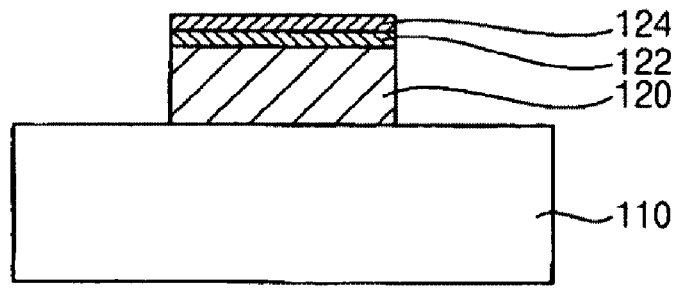
FIGS. 2 to 5 are cross-sectional views illustrating a method of forming a wiring including a carbon nanotube wiring according to example embodiments.

Referring to FIG. 2, a lower wiring 120 may be formed on a substrate 110. For example, a lower metal layer (not illustrated) may be formed on the substrate 110. The lower metal layer may be formed by depositing a metal (e.g., tantalum (Ta), copper (Cu), tungsten (W), titanium (Ti) or aluminum (Al), etc.). A preliminary first contact metal layer (not illustrated) and a preliminary catalyst layer (not illustrated) may be sequentially formed on the lower metal layer. The preliminary catalyst layer may be formed to a thickness of about several nanometers to about several tens of nanometers to accelerate the growth of a carbon nanotube on the surface of the first contact metal layer.

The preliminary catalyst layer, the preliminary first contact metal layer and the lower metal layer may be sequentially patterned using an etching mask (e.g., a silicon nitride layer pattern) to form the lower wiring 120, a first contact metal layer 122 and a catalyst layer 124 on the substrate 110. For example, the lower wiring 120, the first contact metal layer 122 and the catalyst layer 124 may be formed by a dry etching process. Alternatively, the lower wiring 120, the first contact metal layer 122 and the catalyst layer 124 may be formed by a wet etching process.

Figure 3:
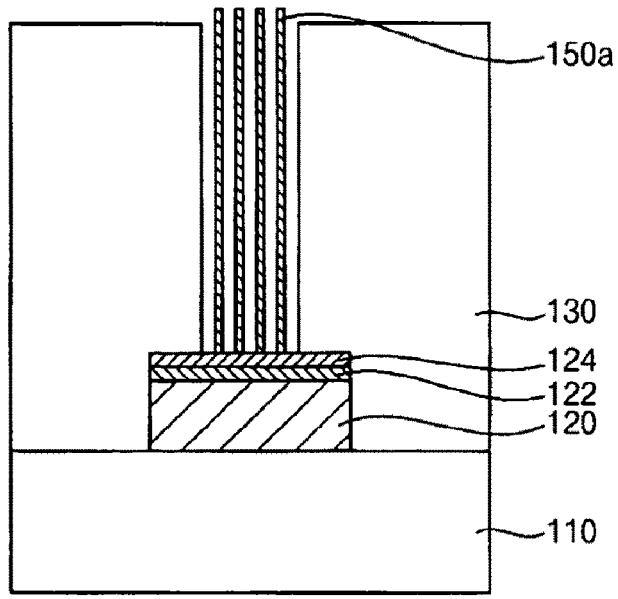

Referring to FIG. 3, an insulating interlayer (not illustrated) may be formed on the catalyst layer 124 and the substrate 110 to cover the substrate 110, the lower wiring 120, the first contact metal layer 122 and the catalyst layer 124. After forming an etching mask (e.g., a silicon nitride layer pattern) on the insulating interlayer, an exposed portion of the insulating interlayer may be anisotropically etched using the etching mask to form an insulating interlayer pattern 130 having an opening. The opening may partially or fully expose a surface of the catalyst layer 124. The insulating interlayer pattern 130 having the opening may be formed on the catalyst layer 124 and substrate 110.

A carbon nanotube 150a may be formed on the catalyst layer 124 and through the opening. The carbon nanotube 150a may be grown from the catalyst layer 124 toward an entrance of the opening. The carbon nanotube 150a may be formed by a deposition process such as a chemical vapor deposition (CVD) process or a plasma enhanced chemical vapor deposition (PECVD) using a carbon-containing source gas. For example, the carbon nanotube 150a may be formed by the CVD process using a source gas of hydrogen carbon (e.g., methane ($CH_4$), ethane ($C_2H_6$), or propane ($C_3H_8$)). The carbon nanotube 150a may be formed at a temperature of about 400° C. to about 700° C. under a pressure of about 10 Torr to about 300 Torr.

When a CVD process using the source gas having carbon is carried out, the source gas having carbon may be thermally decomposed to generate carbon atoms. The carbon atoms may be introduced into the opening. The carbon atoms introduced into the opening may be chemisorbed on the surface of the catalyst layer 124 to grow the carbon nanotube 150a continuously. As a result, the carbon nanotube 150a electrically connected to the catalyst layer 124 may be formed in the opening. An upper face of the carbon nanotube 150a may be disposed around an upper face of the insulating interlayer pattern 130. In some embodiments, the upper face of the carbon nanotube 150a may be disposed higher than the upper face of the insulating interlayer pattern 130.

Figure 4:
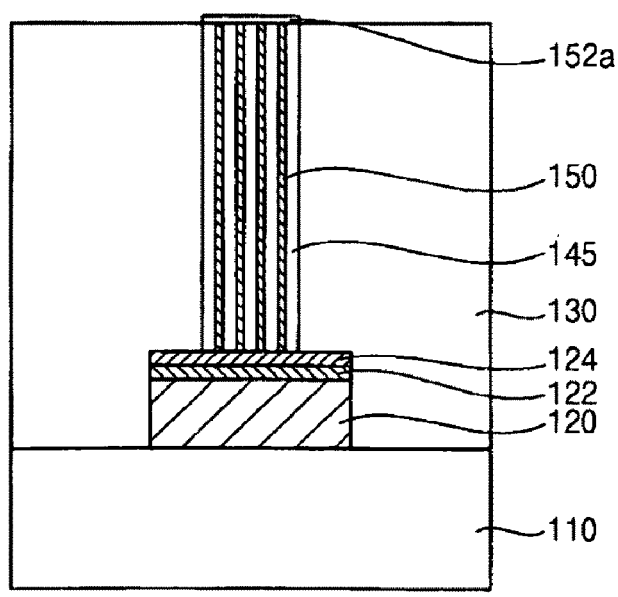

Referring to FIG. 4, the capping layer (not illustrated) may be formed on the insulating interlayer pattern 130 to fill a space of the opening in which the carbon nanotube wiring 150 is formed. The capping layer may be formed to cover the upper face of the insulating interlayer pattern 130. The capping layer may include silicon oxide. Examples of silicon oxide may include BPSG, PSG, USG, SOG, TEOS, PE-TEOS, etc. These may be used alone or in a combination thereof. The capping layer may prevent or retard the carbon nanotube 150a from being severely damaged or fallen down while a chemical mechanical polishing (CMP) process is subsequently performed.

Thereafter, upper portions of the capping layer and the carbon nanotube may be partially removed using a CMP process until the upper face of the insulating interlayer pattern 130 is exposed. The capping layer and the carbon nanotube 150a formed over the upper face of the insulating interlayer may be removed, simultaneously. The carbon nanotube wiring 150 is formed in the opening. An upper face of the carbon nanotube wiring 150 may be exposed. The capping layer pattern 145 may remain in the opening in which the carbon nanotube wiring 150 is formed. A slurry composition that may be used in the CMP process may react with the carbon nanotube at its upper portion to form a native oxide layer 152a on the carbon nanotube wiring 150. The native oxide layer 152a which may has a thickness of about several nanometers to about several tens of nanometers may be formed on a surface of the carbon nanotube wiring 150.

Figure 5:
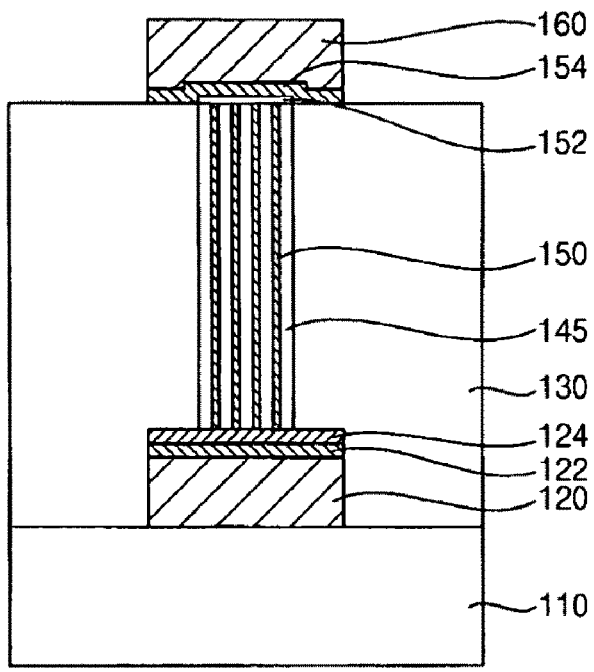

Referring to FIG. 5, a second contact metal layer 154 and an upper wiring 160 may be sequentially formed on the carbon nanotube wiring 150 having the native oxide layer 152a, the capping layer pattern 145 and the insulating interlayer pattern 130. For example, a preliminary second contact metal layer may be formed on the native oxide layer 152a and the insulating interlayer pattern 130, and then an upper metal layer may be formed on the preliminary second contact metal layer. The upper metal layer may be formed using a metal (e.g., tantalum (Ta), copper (Cu), tungsten (W), titanium (Ti), aluminum (Al), etc.).

For example, the preliminary second contact metal layer may have a thickness sufficient to inhibit metal atoms of the upper wiring from being diffused up to the carbon nanotube wiring 150. The thickness of the second contact metal layer may be properly selected or adjusted as considering a balance of an increase of wiring resistance caused by a resistivity increase of the second contact metal layer, and alloying of the second contact metal layer and metal atoms diffused from an upper wiring. For example, when the thickness of the second contact metal layer increases, resistance of wirings may also increase. Thus, an increase of the thickness of the second contact metal layer may be limited. Furthermore, a portion of the second contact metal layer may form an alloy with metal atoms diffused from the upper wiring adjacent to the second contact metal layer. Thus, the thickness of the second contact metal layer may not be reduced without any limit. Thereafter, the preliminary second contact metal layer and the upper metal layer may be sequentially etched using an etching mask defining a layout of the upper wiring 160. As a result, the second contact metal layer 154 and the upper wiring 160 may be formed on the carbon nanotube wiring 150 having the native oxide layer 152*a*, the capping layer pattern 145 and the insulating interlayer pattern 130.

Thermal stress may be generated at an interface between the carbon nanotube wiring 150 and the upper wiring 160 to cause a dielectric breakdown of the native oxide layer 152*a*. As a result, a native oxide layer 152 being dielectrically broken down may be formed. The thermal stress may be provided by heat that may be generated from applied current.

A wiring of a semiconductor device which includes the carbon nanotube wiring 150 and the native oxide layer 152 being dielectrically broken down may be formed. The carbon nanotube wiring 150 may be electrically connected to the second contact metal layer 154 without an electrical insulation of the native oxide layer 150. The above-described wiring including the carbon nanotube wiring may be applied to various wirings in a dynamic random access memory (DRAM) device, a flash memory device or a phase-change memory device, instead of metal wiring.

Evaluation of a Wiring Including Carbon Nanotube

A wiring including a carbon nanotube wiring illustrated in FIG. 5 was prepared by the method of Embodiment 1. Current which may cause generation of thermal stress was applied to the wiring. Variations of contact resistance at an interface between the carbon nanotube wiring and the upper wiring were measured with respect to current applied to the wiring. The applied current was about 1 mA, about 2 mA, about 3 mA and about 4 mA, respectively.

Figure 6:
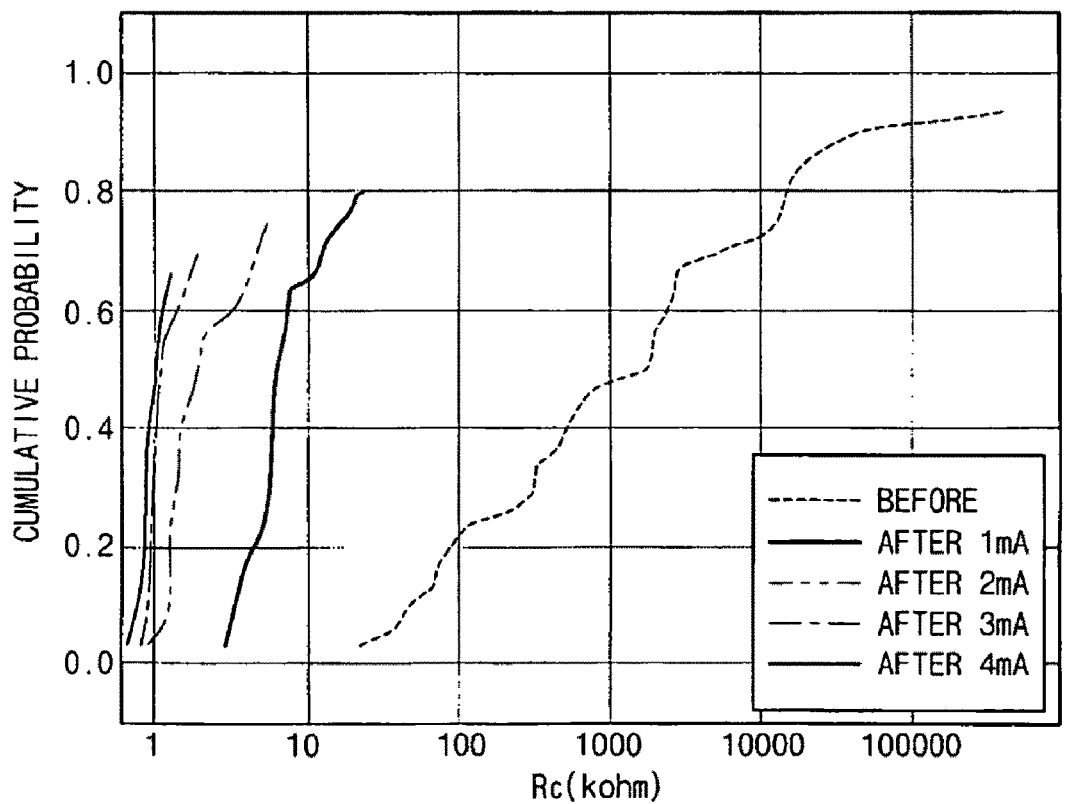
FIG. 6 is a graph illustrating a relation between contact resistance and a current applied to the wiring having a carbon nanotube wiring.

FIG. 6 is a graph illustrating the relationship between the applied current and contact resistance. The horizontal axis represents contact resistance variations with respect to current applied to the wiring including the carbon nanotube wiring, and the vertical axis indicates cumulative probability distribution.

Referring to FIG. 6, it may be noted that the contact resistance between the carbon nanotube wiring and an upper wiring decreases, as the current applied to the wiring including the carbon nanotube wiring increases. It may be also confirmed that when the current of at least 2 mA is applied to the wiring, the contact resistance between the carbon nanotube wiring and the upper wiring considerably decreases. When current is applied to the wiring including the carbon nanotube, joule heating generated by current applied to the wiring may cause a dielectric breakdown of the native oxide layer formed on the surface of the carbon nanotube wiring. Simultaneously, a metal contained in the second contact metal layer partially melt, so a portion of the second contact metal layer may make a direct contact with the carbon nanotube wiring. Therefore, the decrease of the contact resistance at the interface between the carbon nanotube wiring and the upper wiring may occur.

Embodiment 2

Figure 7:
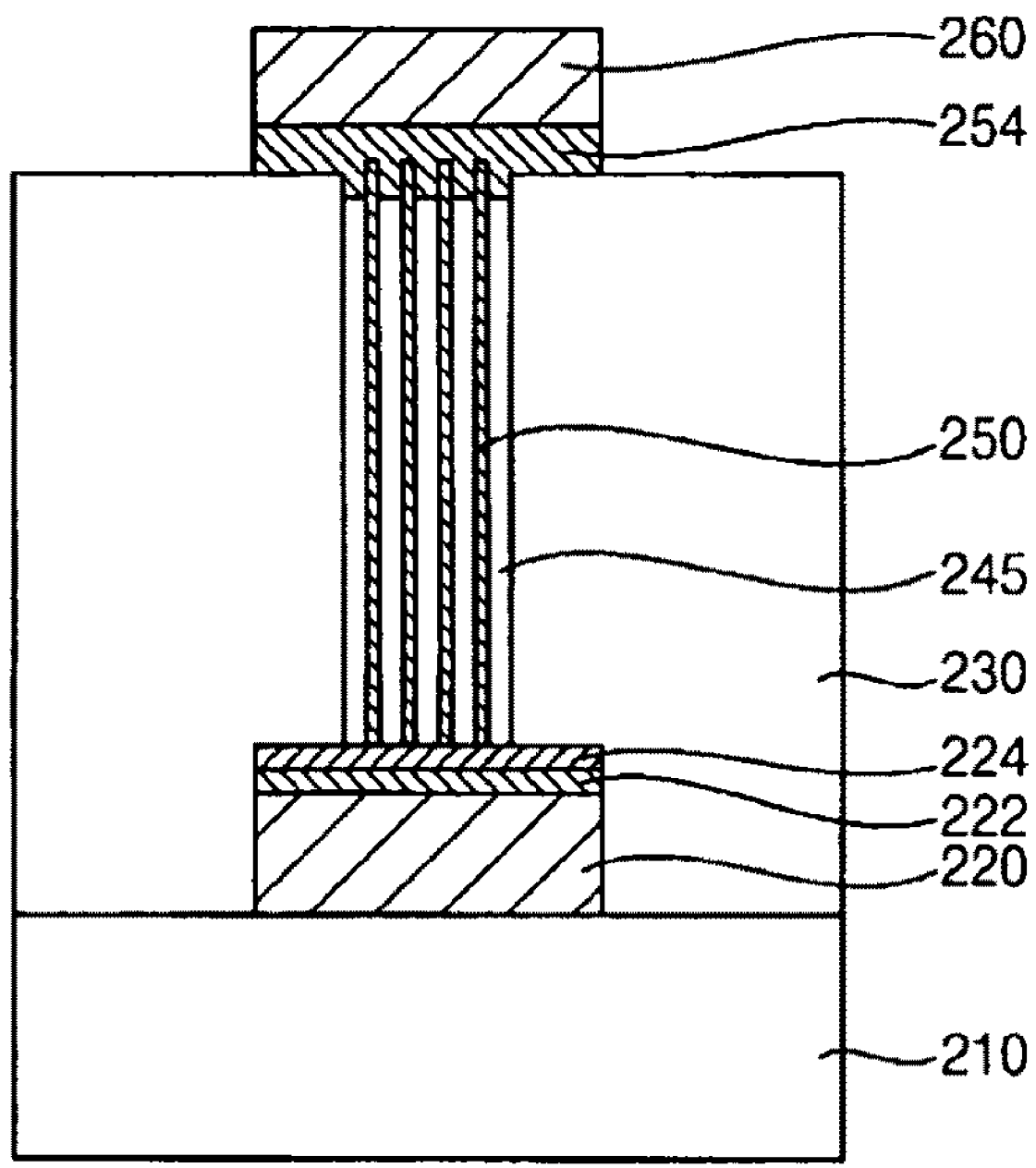
FIG. 7 is a cross-sectional view illustrating a wiring including a carbon nanotube wiring according to other example embodiments.

FIG. 7 is a cross-sectional view illustrating a wiring including a carbon nanotube wiring according to other example embodiments.

Referring to FIG. 7, a semiconductor device may include a substrate 210, a lower wiring 220 provided on the substrate 210, a first contact metal layer 222, a catalyst layer 224, an insulating interlayer pattern 230, a capping layer pattern 245, a carbon nanotube wiring 250, a second contact metal layer 254 and a upper wiring 260. Description of the first contact metal layer 222, the catalyst layer 224, the insulating interlayer pattern 230, the carbon nanotube wiring 250 and the upper wiring 260 may be the same as that of corresponding elements in Embodiment 1, so description of these elements will not be repeated.

The capping layer pattern 245 may be formed on the catalyst layer 224 to fill the opening in which the carbon nanotube wiring 250 may be formed. An upper face of the capping layer pattern 245 may be disposed lower than an upper face of the insulating interlayer pattern 230. The upper face of the capping layer pattern 245 may also be disposed lower than the upper face of the carbon nanotube wiring 250. Additionally, the upper face of the insulating interlayer pattern 230 may be disposed lower than the upper face of the carbon nanotube wiring 250. A portion of the second contact metal layer 254 provided under the upper wiring 260 may be disposed to fill a space between carbon nanotubes, because the capping layer pattern 245 is partially etched. Thus, the second contact metal layer 254 may directly connect the carbon nanotube wiring 250 to the upper wiring 260, and thus contact resistance of a wiring including the carbon nanotube wiring 250 may decrease.

Figure 8:
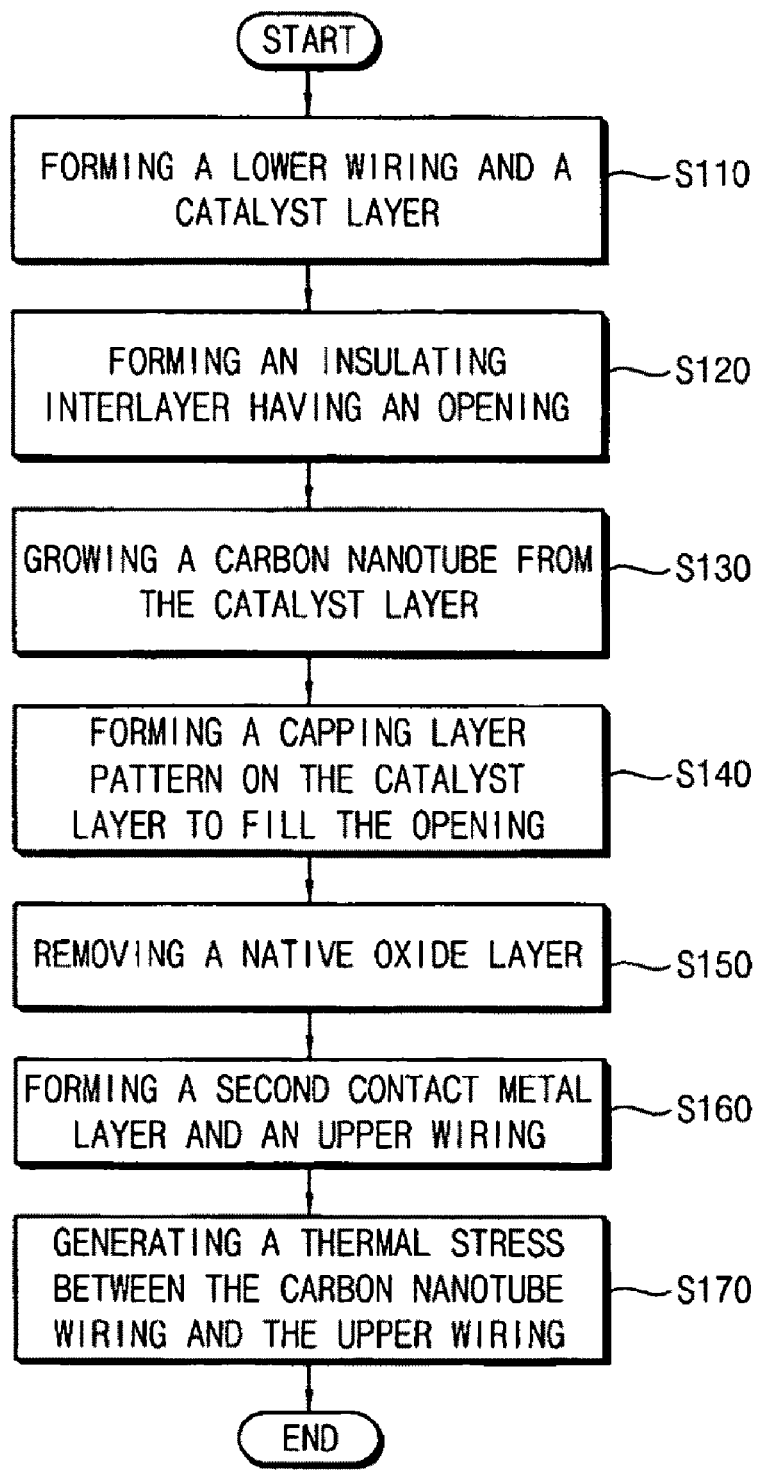
FIG. 8 is a flow chart illustrating a method of forming a wiring including a carbon nanotube wiring in FIG. 7.

FIG. 8 is a flow chart illustrating a method of forming a wiring including a carbon nanotube wiring illustrated in FIG. 7.

Referring to FIG. 8, a lower wiring 220, a first contact metal layer 222 and a catalyst layer 224 may be sequentially formed on a substrate 210 (S110). Sequentially, an insulating interlayer pattern 230 having an opening which may expose the catalyst layer 224 may be formed on the substrate 210 and the catalyst layer 224 (S120). Description of these steps may be substantially the same as those with reference to FIG. 2, and, therefore, will not be repeated.

Sequentially, a carbon nanotube (not illustrated) may be grown from a surface of the catalyst layer 224 through the opening of the insulating interlayer pattern 230 until an upper face of the carbon nanotube is disposed higher than an upper face of the insulating interlayer pattern 230 (S130). Description of these steps may be substantially the same as those with reference to FIG. 3, and, therefore, will not be repeated. A carbon nanotube wiring 250 and a capping layer pattern 245 may be formed on the catalyst layer 224 in the opening of the insulating interlayer pattern 230 (S140). For example, a capping layer (not illustrated) may be formed on the catalyst layer 124 to fill the opening in which the carbon nanotube is formed. The capping layer may be formed to cover the upper face of the insulating interlayer pattern 230. Thereafter, the capping layer and the carbon nanotube may be partially removed using a chemical mechanical polising (CMP) process until the upper face of the insulating interlayer pattern 230 is exposed. As a result, the carbon nanotube wiring 250 and the capping layer pattern 245 may be formed in the opening, simultaneously. A native oxide layer (not illustrated) which may have a thickness of about several angstroms to about several tens of angstroms may be formed on a surface of the carbon nanotube wiring 150. The native oxide layer may be generated by a reaction of a carbon nanotube with a slurry composition used in the CMP process. Description of these steps may be substantially the same as those with reference to FIG. 4, and, therefore, will not be repeated. A dry etching process or a wet etching process may be performed on the native oxide layer formed on the surface of the carbon nanotube wiring 150 to remove the native oxide layer from the carbon nanotube wiring 150 (S150).

When the native oxide layer is removed from the surface of the carbon nanotube wiring 150 by performing the dry etching process or the wet etching process, upper portions of the capping layer pattern 245 and the insulating interlayer pattern 230 may also be partially etched. Thus, the upper portion of the carbon nanotube wiring 150 may be exposed, and the upper face of the carbon nanotube wiring 150 may be disposed higher than an upper face of the insulating interlayer pattern 230.

As one example, a cleaning process using a cleaning solution including hydrofluoric acid may be performed to remove the native oxide layer from the carbon nanotube wiring 150. While performing the cleaning process, the upper portions of the capping layer pattern 245 and the insulating interlayer pattern 230 may be partially removed. When the capping layer pattern 245, the insulating interlayer pattern 230 and the native oxide layer are an oxide material, these may be simultaneously etched by the cleaning solution including hydrofluoric acid.

As another example, an etching process may be performed on the native oxide layer using plasma of a fluorine-containing gas (e.g., $CF_4$, $C_4F_8$ or $C_4F_6$) or a gas mixture of the fluorine-containing gas, Ar and $O_2$. While performing the etching process, the upper portions of the capping layer pattern 245 and the insulating interlayer pattern 230 may also be partially removed. The plasma of a fluorine-containing gas may include fluorine ions and/or fluorine radicals. An etching gas including a fluorine-containing gas may be excited into a plasma state.

A second contact metal layer 254 and an upper wiring 260 may be sequentially formed on the carbon nanotube wiring 250, the capping layer pattern 245 and the insulating interlayer pattern 230 (S160). For example, a preliminary second contact metal layer (not illustrated) and an upper metal layer (not illustrated) may be sequentially formed on the carbon nanotube wiring 250, the capping layer pattern 245 and the insulating interlayer pattern 230. The preliminary second contact metal layer and the upper metal layer may be sequentially etched using an etching mask defining a layout of the upper wiring 260. As a result, the second contact metal layer 254 and the upper wiring 260 may be formed on the carbon nanotube wiring 250, the capping layer pattern 245 and the insulating interlayer pattern 230.

A portion of the second contact metal layer 254 contacting the carbon nanotube wiring 250 may partially melt by a thermal stress generated between the carbon nanotube wiring 250 and the upper wiring 260 (S170). The thermal stress may be provided by heat generated by applied current.

As illustrated in FIG. 7, a partially melted portion of the second contact metal layer 254 may fill spaces disposed between carbon nanotubes at the entrance of the opening. Thus, contact surface area between the second contact metal layer 254 and the carbon nanotube wiring 250 may become substantially large. As a result, the carbon nanotube wiring 250 may be electrically connected to the upper wiring 260 via the second contact metal layer 254, and contact resistance of wiring in semiconductor device may decrease.

Evaluation of a Wiring Including Carbon Nanotube

An etching process using plasma including a fluorine-containing gas and oxygen gas was performed on the native oxide layer formed on the carbon nanotube wiring which was obtained by performing sequential steps from S100 to S140. A remaining native oxide layer on a surface of the carbon nanotube wiring in accordance with the passage of etching time was observed using an electron microscope.

Figure 9:
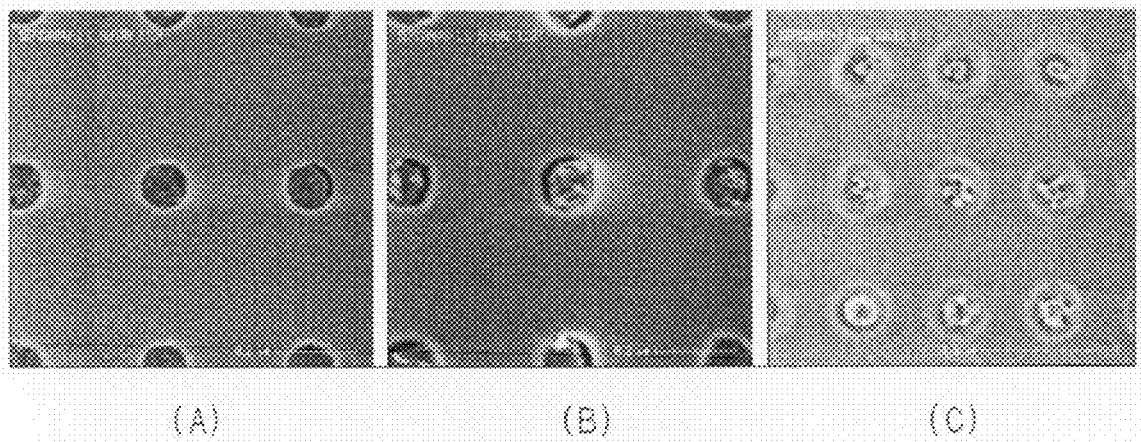
FIG. 9 contains electron microscope images showing the remaining native oxide layer on the surface of the carbon nanotube wiring in accordance with the passage of the plasma etching time.

FIG. 9 contains electron microscope images illustrating the remaining native oxide layer on the surface of the carbon nanotube wiring in accordance with the passage of the plasma etching time. The first image (A) was represent the initial state before etching (i.e., 0 second of the etching time), and the second image (B) and the third image (C) represent etching time of about 11 seconds and about 22 seconds, respectively.

Referring to FIG. 9, it may be noted that the native oxide layer may be largely removed from the surface of the carbon nanotube wiring, as the etching time increases. When the etching process was performed for about 11 seconds as shown in the second image (B) of FIG. 9, the surface of the carbon nanotube wiring was partially exposed. As shown in the third image (C) of FIG. 9, in the case in which the etching process was performed for about 22 seconds, the surface of the carbon nanotube wiring was substantially exposed and the native oxide layer may be mostly removed. Further, it was also confirmed that an upper face of the carbon nanotube wiring was disposed higher than an upper face of an insulating interlayer pattern, and the upper portion of the carbon nanotube wiring was partially exposed.

Embodiment 3

Figure 10:
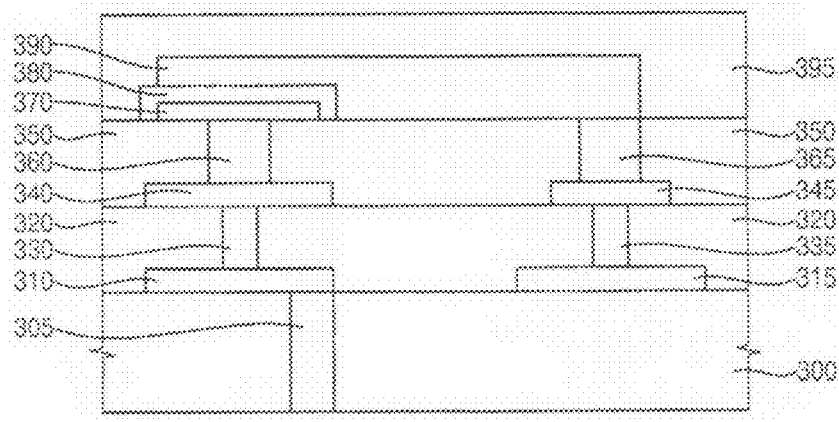
FIG. 10 is a cross-sectional view illustrating a decoupling capacitor in a logic device according to example embodiments.

FIG. 10 is a cross-sectional view illustrating a decoupling capacitor in a logic device according to another example embodiment.

Referring to FIG. 10, a decoupling capacitor may include a substrate 300, a ground line 305, a first contact pad 310, a first insulating interlayer 320, a first contact plug 330, a second contact pad 340, a second insulating interlayer 350, a second contact plug 360, a lower electrode 370, a dielectric layer 380, an upper electrode 390 and a protective layer 395.

The ground line 305 may be provided on the substrate 300. The ground line may be a wiring including carbon nanotube, conductive polysilicon or a metal. The first contact pad 310 may be provided on the substrate. The first contact pad 310 is a first metal wiring and is connected to the ground line 305 or a power line (not illustrated). The first contact pad may include a catalyst layer (not illustrated) and a contact metal layer (not illustrated). The first insulating interlayer 320 is provided between the first contact pad 310 and the second contact pad 340. The first contact pad 310 is insulated from the second contact pad 340 by the first insulating interlayer 320.

The first insulating interlayer 320 may include boro-phosphor silicate glass (BPSG) oxide, high density plasma (HDP) oxide, chemical vapor deposition (CVD) oxide, etc. These may be used alone or in a mixture thereof. The first insulating interlayer 320 has an opening which exposes the first contact pad 310.

The first contact plug 330 may be formed in the opening, and may also be electrically connected between the first contact pad 310 and the second contact pad 340. The first contact plug 330 may include a carbon nanotube wiring. The second contact pad 340 is provided on the first insulating interlayer 320 and the first contact plug 330. The second contact pad 340 may include a second metal wiring and may be electrically connected to the carbon nanotube wiring. The first contact plug 330, the first contact pad 310 and the second contact pad 340 may be the same as the wiring including carbon nanotube in accordance with Embodiments 1 and 2.

The second insulating interlayer 350 may be provided between the second contact pad 340 and the lower electrode 370. The second contact pad 340 may be insulated from the lower electrode 370 by the second insulating interlayer 350. The second insulating interlayer 350 may have an opening which exposes the second contact pad 340. The second contact plug 360 may be formed in the opening. The second contact plug 360 may include a carbon nanotube wiring.

The lower electrode 370 may be provided on the second insulating interlayer 350 and the second contact plug 360. The lower electrode 370 may be formed using a metal and/or a metal compound including titanium (Ti), platinum (Pt), titanium nitride (TiNx), tantalum nitride (TaNx), etc. The dielectric layer 380 may be provided on the lower electrode 370 and the second insulating interlayer 350. The upper electrode 390 may be provided on the dielectric layer 380. The upper electrode 390 may be formed using a material substantially the same as that of the lower electrode 370. One portion of the upper electrode 390 may be connected to the dielectric layer 380 in the capacitor and the other portion of the upper electrode 390 may be connected to the second contact plug 360 electrically connected to a power line.

The protective layer 395 may be provided on the capacitor and the second insulating interlayer 350. The above-described decoupling capacitor may operate as a capacitor having large capacity in a logic device to improve an operational speed.

Embodiment 4

Figure 11:
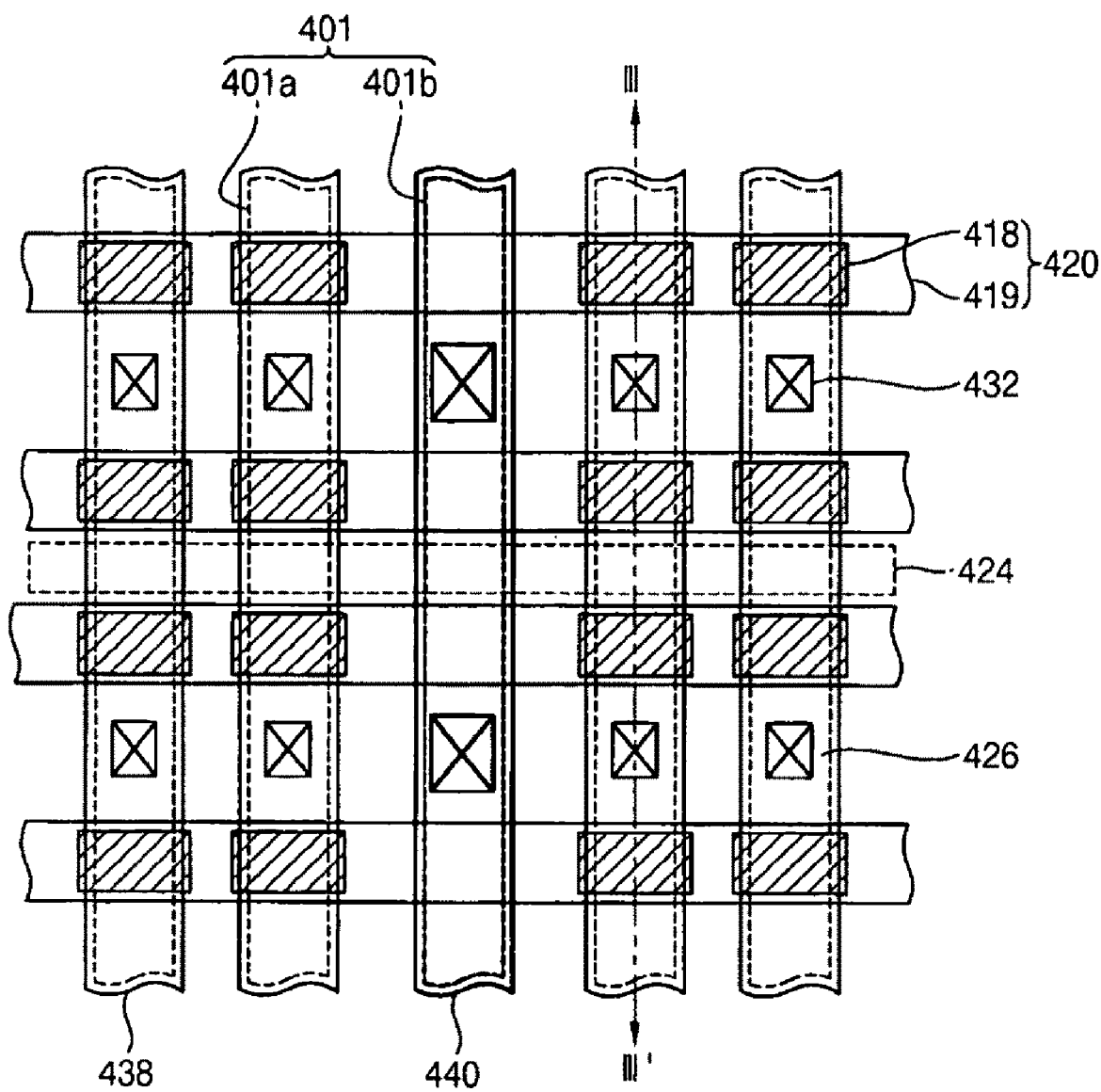
FIG. 11 is a plan view illustrating a flash memory device according to example embodiments.
Figure 12:
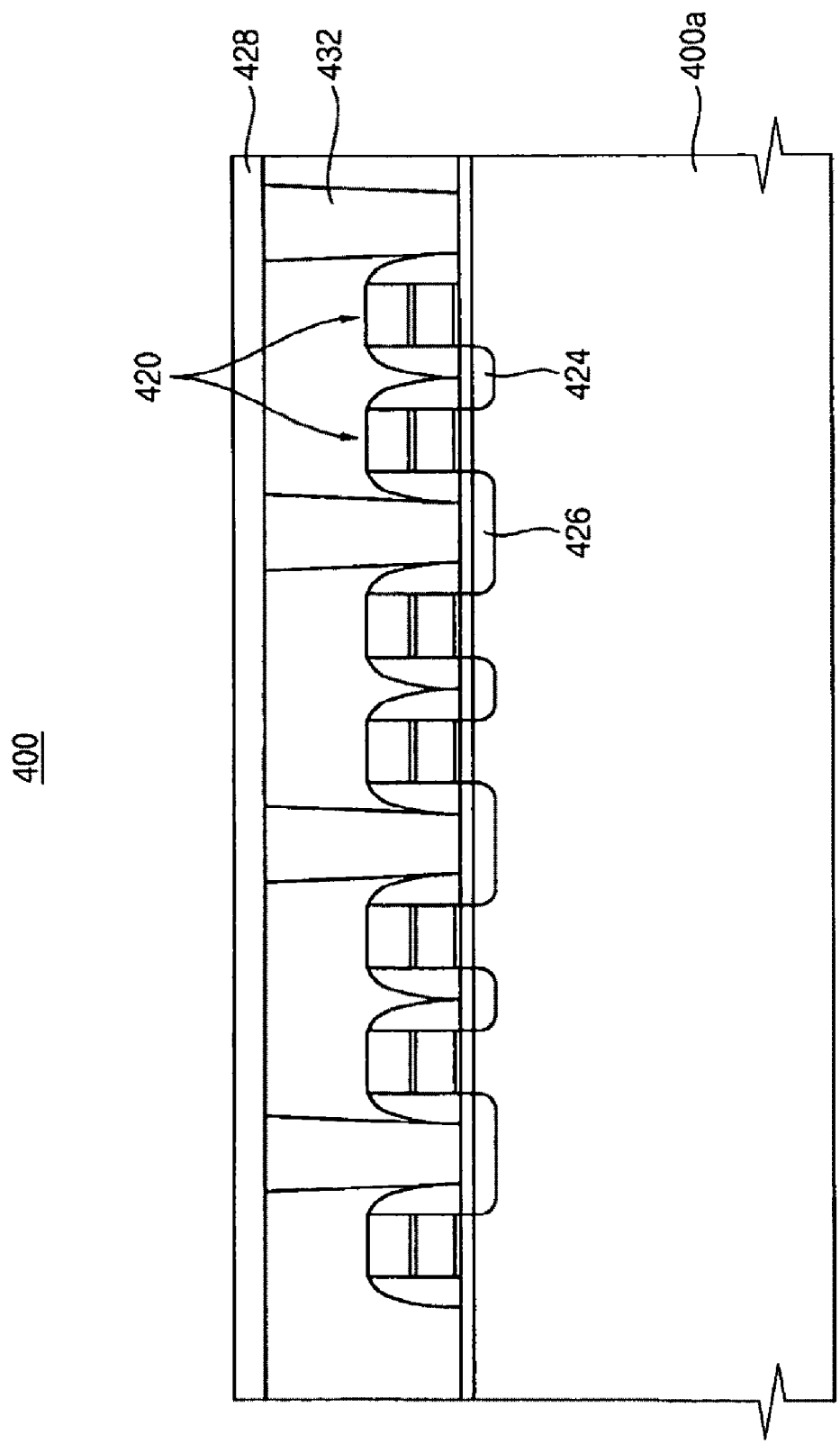
FIG. 12 is a cross-sectional view taken along line III-III' in FIG. 11.

FIG. 11 is a plan view illustrating a flash memory device according to another example embodiment. FIG. 12 is a cross-sectional view taken along line III-III' in FIG. 11.

Referring to FIGS. 11 and 12, in a NOR flash memory device 400, an active region 401 is defined on a semiconductor substrate 400a in accordance with a formation of an isolation layer (not illustrated) in a given or predetermined region of the semiconductor substrate 400a. A plurality of word line patterns 420 is disposed along a first direction crossing the active region 401.

A plurality of word line patterns 420 is provided on the semiconductor substrate 400a and cross the active region 401. Each of the word line patterns 420 includes a floating gate pattern 418, a gate interlayer dielectric layer (not illustrated) and a control gate 103, which are sequentially stacked. Drain regions 426 are provided in cell active regions 401a along one sidewall of the word line patterns 420 and bit line contacts 432 including carbon nanotube are provided in the drain regions. A common source line 424, which is typically self-aligned to the word line patterns 420, is provided along the other sidewall of the word line patterns 420, and a common source contact (not illustrated) including carbon nanotube is provided in a region between the common source line 424 and source active region 401b.

The bit line contact 432 may be formed in a bit line contact hole to include a carbon nanotube wiring in accordance with Embodiments 1 and 2. Bit line 438 electrically connected to the bit line contact 432 may be an upper wiring in accordance with Embodiments 1 and 2.

The bit lines 438 are provided on the active cell regions 401a crossing the word line patterns 420. The common source contact including carbon nanotube wiring in accordance with Embodiments 1 and 2 is formed in common source contact hole. The common source line 424 electrically connected to the common source contact may include the upper wiring in accordance with Embodiments 1 and 2. The common source line 424 is provided on the source active region 401b parallel with the bit line 438.

Embodiment 5

Figure 13:
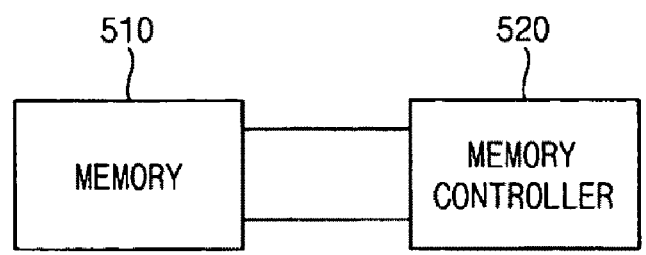
FIG. 13 is a block diagram illustrating another example embodiment.

FIG. 13 is a block diagram illustrating another example embodiment. Referring to FIG. 13, a memory 510 is connected to a memory controller 520. The memory 510 may be a dynamic random access memory (DRAM) device, a NAND flash memory device. Wiring including a carbon nanotube in accordance with Embodiments 1 and 2 may be applied to the dynamic random access memory (DRAM) device, the NAND flash memory device. However, the memory 510 is not limited to NAND flash memory, and may be NOR flash memory having memory cells formed according to an embodiment. The memory controller 520 may provide input signals to control operations of the memory device 520. For example, a memory controller of a memory card may transfer a command of a host to control input/output data and control various data of a memory based on an applied control signal. The memory 510 and the memory controller 520 may be applied to not only a memory card but also digital products including a memory. The wiring including carbon nanotube in accordance with Embodiments 1 and 2 may be applied to a logic circuit of the memory controller 520.

Embodiment 6

Figure 14:
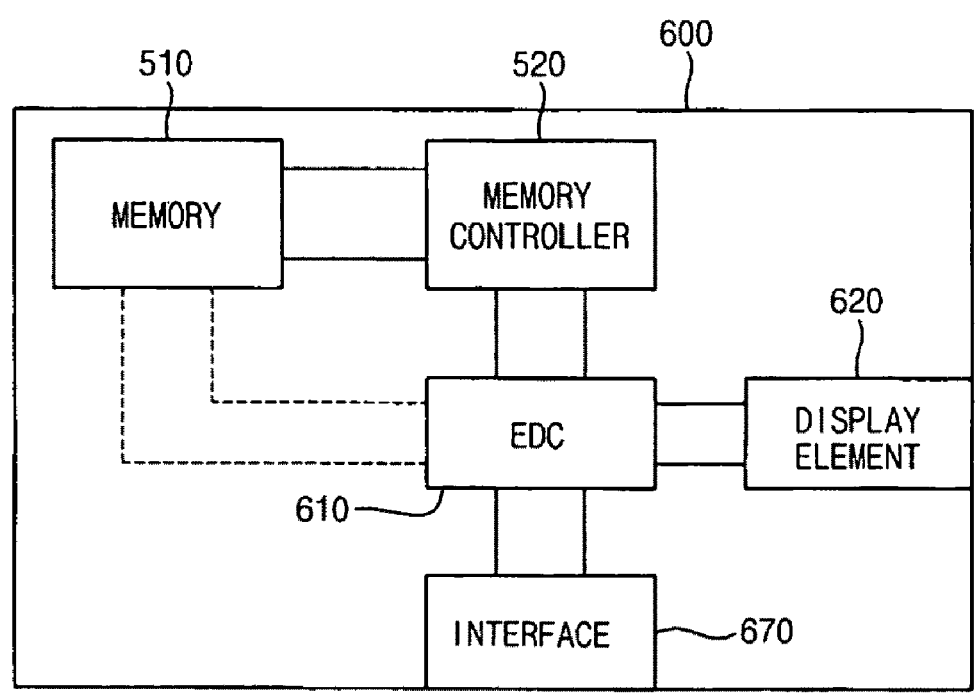
FIG. 14 is a block diagram illustrating still another example embodiment.

FIG. 14 is a block diagram illustrating another example embodiment.

Referring to FIG. 14, this example embodiment represents a portable device 600.

Examples of the portable device 600 may include a MP3 player, an audio player, a video player, a portable-multi-media player which are capable of playing audio and video, etc. The portable device 600 may include a memory 510, a memory controller 520, an encoder and decoder (EDC) 610, presentation components 620 and interface 630.

The memory 510 may be a dynamic random access memory (DRAM) device, a NAND flash memory device. Wiring in accordance with Embodiments 1 and 2 may be applied to the dynamic random access memory (DRAM) device, the NAND flash memory device.

Data is input to and output from the memory 510 via the memory controller 520 by an encoder and decoder (EDC) 610. As shown by the dashed lines in FIG. 14, the data may be directly input to the memory 510 from the EDC 610 and/or directly output from the memory 510 to the EDC 610.

The EDC 610 encodes data for storage in the memory 510. For example, the EDC 610 may perform MP3 encoding on audio data for storage in the memory 510. Alternatively, the EDC 610 may perform MPEG encoding (e.g., MPEG2, MPEG4, etc.) on video data for storage in the memory 510.

Still further, the EDC 610 may include multiple encoders for encoding different types of data according to different data formats. For example, the EDC 610 may include an MP3 encoder for audio data and an MPEG encoder for video data.

The EDC 610 may decode output from the memory 510. For example, the EDC 610 may perform MP3 decoding on audio data output from the memory 510. Alternatively, the EDC 610 may perform MPEG decoding (e.g., MPEG2, MPEG4, etc.) on video data output from the memory 510. Still further, the EDC 610 may include multiple decoders for decoding different types of data according to different data formats. For example, the EDC 610 may include an MP3 decoder for audio data and an MPEG decoder for video data.

It will also be understood that EDC 610 may include only decoders. For example, already encoded data may be received by the EDC 610 and passed to the memory controller 520 and/or the memory 510.

The EDC 610 may receive data for encoding, or receive already encoded data, via the interface 630. The interface 630 may conform to a known standard (e.g., firewire, USB, etc.). The interface 630 may also include more than one interface. For example, interface 630 may include a firewire interface, a USB interface, etc. Data from the memory 510 may also be output via the interface 630.

The presentation components 620 may present data output from the memory, and/or decoded by the EDC 610, to a user. For example, the presentation components 620 may include a speaker jack for outputting audio data, a display screen for outputting video data, and/or etc.

Embodiment 7

Figure 15:
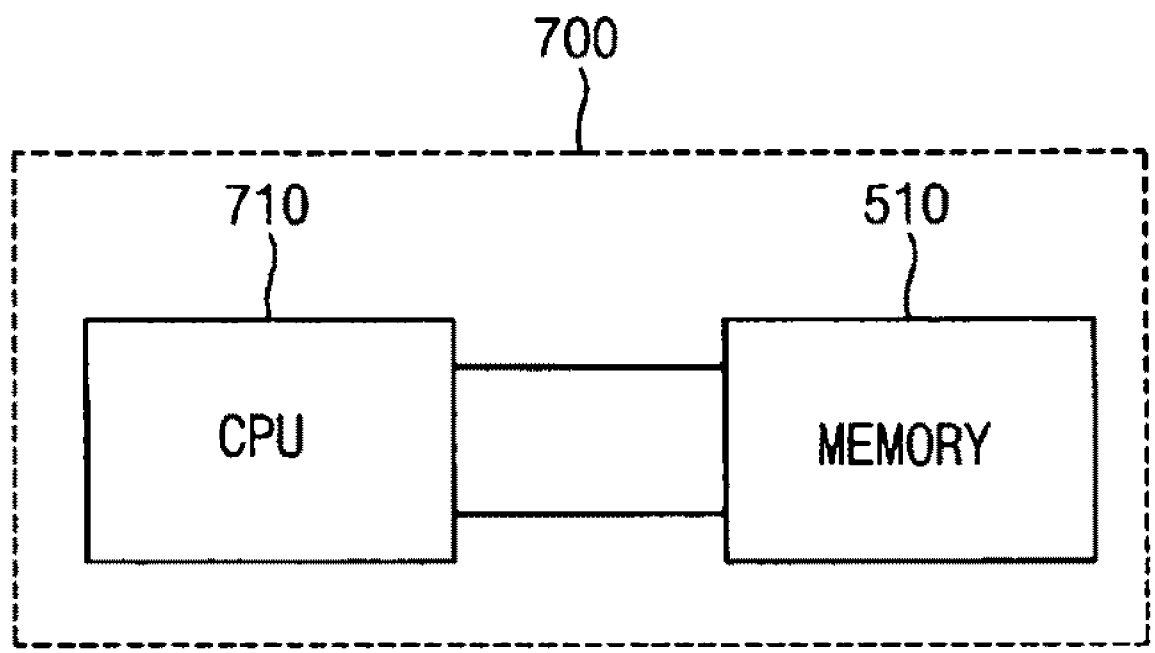
FIG. 15 is a block diagram illustrating still another example embodiment.

FIG. 15 is a block diagram illustrating another example embodiment.

Referring to FIG. 15, a memory 510 is connected to a central processing unit (CPU) 710 within a computer system 700. The memory 510 includes a NAND flash memory device. Wiring in accordance with Embodiments 1 and 2 may be applied to the NAND flash memory device. As one example, the computer system 700 may be laptop computer using flash memory devices as a main storage medium. As another example, the computer system 700 may be digital products including the memory 510 which is capable of storing data and controlling function of the digital products. The memory 510 may be directly connected with the CPU 710, connected via bus, etc. It will be appreciated that FIG. 15 does not illustrate the full complement of components that may be included within a computer system 700 for the sake of clarity.

According to example embodiments, a native oxide layer formed at an interface between a carbon nanotube wiring and an upper wiring may be dielectrically broken down by generating a thermal stress between the carbon nanotube wiring and the upper wiring. Accordingly, electrical contact resistance between the carbon nanotube wiring and the upper wiring may be reduced. A portion of a contact metal layer contacting to the carbon nanotube wiring may be partially melted by the thermal stress. Therefore, the carbon nanotube wiring may be electrically or directly connected to the upper wiring via the contact metal layer and electrical resistance of the wiring may further decreases. In addition, adhesiveness between the carbon nanotube wiring and the contact metal layer may also increase, and stability of a device or a manufacturing efficiency may be enhanced.

The foregoing is illustrative of example embodiments and is not to be construed as limiting thereof. Although a few example embodiments have been described, those skilled in the art will readily appreciate that many modifications are possible in the example embodiments without materially departing from the novel teachings of example embodiments. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of forming a wiring having a carbon nanotube, comprising:
    forming a lower wiring on a substrate;
    forming a catalyst layer on the lower wiring;
    forming an insulating interlayer on the substrate to cover the catalyst layer;
    forming an opening through the insulating interlayer to expose an upper face of the catalyst layer;
    forming a carbon nanotube wiring in the opening;
    forming an upper wiring on the carbon nanotube wiring and the insulating interlayer, the upper wiring being electrically connected to the carbon nanotube wiring; and
    generating a thermal stress between the carbon nanotube wiring and the upper wiring to produce a dielectric breakdown of a native oxide layer formed on a surface of the carbon nanotube wiring.

2. The method of claim 1, wherein the thermal stress is generated by providing current to the carbon nanotube wiring, and the thermal stress induces partial melting of a metal contained in the upper wiring.

3. The method of claim 2, wherein an amount of the current is in a range of about 1 mA to about 5 mA.

4. The method of claim 1, wherein forming the carbon nanotube wiring comprises:
    growing at least one carbon nanotube from the catalyst layer toward an entrance of the opening;
    forming a capping layer on the insulating interlayer to fill the opening in which the carbon nanotube is formed; and
    performing a chemical mechanical polishing (CMP) process on the capping layer until upper faces of the insulating interlayer pattern and the at least one carbon nanotube are exposed.

5. The method of claim 4, wherein the native oxide layer is formed on an upper surface of the at least one carbon nanotube by a reaction with a slurry applied to the CMP process.

6. The method of claim 1, further comprising forming a first contact metal layer on the lower wiring before forming the catalyst layer.

7. The method of claim 1, further comprising forming a second contact metal layer on the carbon nanotube wiring and the insulating interlayer before forming the upper wiring.

8. The method of claim 7, wherein the second contact metal layer is formed using a metal including titanium (Ti) to have a thickness sufficient to inhibit a metal atom of the upper wiring from being diffused up to the carbon nanotube wiring.

9. A method of forming a wiring having a carbon nanotube, comprising:
    forming a lower wiring on a substrate;
    forming a catalyst layer on the lower wiring;
    forming an insulating interlayer having an opening on the catalyst layer and the substrate, the opening exposing the catalyst layer;
    growing a carbon nanotube from the catalyst layer toward an entrance of the opening;
    forming a capping layer on the insulating interlayer to fill the opening in which the carbon nanotube is formed;
    partially removing the capping layer and the carbon nanotube to form a carbon nanotube wiring by performing a chemical mechanical polishing (CMP) process until upper faces of the insulating interlayer and the carbon nanotube are exposed;

removing a native oxide layer from an upper surface of the carbon nanotube wiring and partially removing the insulating interlayer such that an upper portion of the carbon nanotube wiring is protruded from the insulating interlayer, the native oxide layer being formed on the carbon nanotube wiring while performing the CMP process; and forming an upper wiring on the carbon nanotube wiring and the insulating interlayer, the upper wiring being electrically connected to the carbon nanotube wiring.

10. The method of claim 9, wherein the native oxide layer is removed by performing a cleaning process using a cleaning solution including hydrofluoric acid.

11. The method of claim 9, wherein the native oxide layer is removed by performing an etching process using plasma.

12. The method of claim 9, wherein forming the upper wiring electrically connected to the carbon nanotube wiring further comprises generating a thermal stress between the carbon nanotube wiring and the upper wiring to partially melt a metal of the upper wiring.

13. The method of claim 12, wherein the thermal stress is generated by providing current of from about 1 mA to about 5 mA to the carbon nanotube wiring.

* * * * *